(12) United States Patent
Joiris

(10) Patent No.: US 10,480,772 B2
(45) Date of Patent: Nov. 19, 2019

(54) LIGHT-EMITTING DIODE MODULES

(71) Applicant: SCHREDER, Forest (BE)

(72) Inventor: Samuel Joiris, Flemalle (BE)

(73) Assignee: SCHREDER, Forest (BE)

(*) Notice: Subject to any disclaimer, the term of this patent is extended or adjusted under 35 U.S.C. 154(b) by 0 days.

(21) Appl. No.: 15/231,578

(22) Filed: Aug. 8, 2016

(65) Prior Publication Data

US 2017/0038056 A1 Feb. 9, 2017

(30) Foreign Application Priority Data

Aug. 6, 2015 (EP) .................................. 15180043

(51) Int. Cl.
F21V 31/00 (2006.01)
F21V 5/00 (2018.01)
F21K 9/20 (2016.01)
F21V 29/70 (2015.01)
F21K 9/69 (2016.01)
F21V 17/12 (2006.01)
F21V 19/00 (2006.01)
F21V 23/00 (2015.01)
(Continued)

(52) U.S. Cl.
CPC .............. F21V 31/005 (2013.01); F21K 9/20 (2016.08); F21K 9/69 (2016.08); F21V 5/007 (2013.01); F21V 17/12 (2013.01); F21V 19/003 (2013.01); F21V 23/002 (2013.01); F21V 23/06 (2013.01); F21V 29/70 (2015.01); F21V 5/04 (2013.01); F21V 17/06 (2013.01); F21V 27/02 (2013.01); F21W 2131/10 (2013.01); F21Y 2105/16 (2016.08); F21Y 2115/10 (2016.08); H05K 2201/09063 (2013.01); H05K 2201/10106 (2013.01)

(58) Field of Classification Search
CPC .. F21Y 2115/10; F21Y 2113/13; F21V 15/01; F21V 31/005
USPC ............................................. 362/362
See application file for complete search history.

(56) References Cited

U.S. PATENT DOCUMENTS 8,714,771 B2* 5/2014 Nishimori .......... G01N 21/8806
362/217.02
2008/0273326 A1 11/2008 Wilcox
(Continued)

FOREIGN PATENT DOCUMENTS

CN 101680627 A 3/2010
CN 102272520 12/2011
(Continued)

OTHER PUBLICATIONS

Chinese Office Action dated Jul. 30, 2019 in counterpart CN case (and English translation thereof).

Primary Examiner — William J Carter
(74) Attorney, Agent, or Firm — Ferguson Case Orr Paterson

(57) ABSTRACT

Described herein is an LED module (500) comprising a PCBA (200) having an array of LED elements, a secondary lens array (300) and a lens holder (510). The secondary lens array (300) has a peripheral lip (360) and a plurality of boss portions (330a) which are compressed between the lens holder (510) and the PCBA (200) to form water-tight gaskets. The secondary lens array (300) also forms gaskets around wires connecting with terminal blocks on the PCBA (200) and effectively seals with a base plate (100) on which the PCBA (200) is mounted.

23 Claims, 5 Drawing Sheets

(51) Int. Cl.
    *F21V 23/06*     (2006.01)
    *F21V 5/04*     (2006.01)
    *F21V 17/06*     (2006.01)
    *F21W 131/10*     (2006.01)
    *F21V 27/02*     (2006.01)
    *F21Y 105/16*     (2016.01)
    *F21Y 115/10*     (2016.01)

(56) References Cited

U.S. PATENT DOCUMENTS

| | | | |
|---|---|---|---|
| 2009/0298376 A1* | 12/2009 | Guillien | F21V 5/04 |
| | | | 445/43 |
| 2011/0310600 A1* | 12/2011 | Lehman | F21K 9/90 |
| | | | 362/217.14 |
| 2011/0317425 A1 | 12/2011 | Jeon | |
| 2012/0188766 A1 | 7/2012 | Lu | |

FOREIGN PATENT DOCUMENTS

| | | |
|---|---|---|
| CN | 202947010 | 5/2013 |
| EP | 2497998 A2 | 9/2012 |
| WO | WO 2011/053349 A1 | 5/2011 |
| WO | WO 2012/029002 A1 | 3/2012 |

* cited by examiner

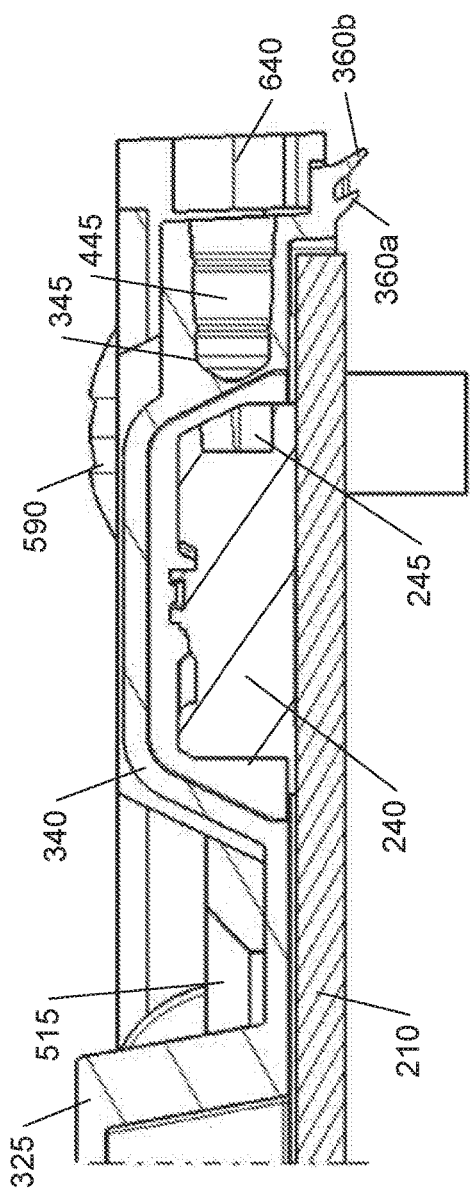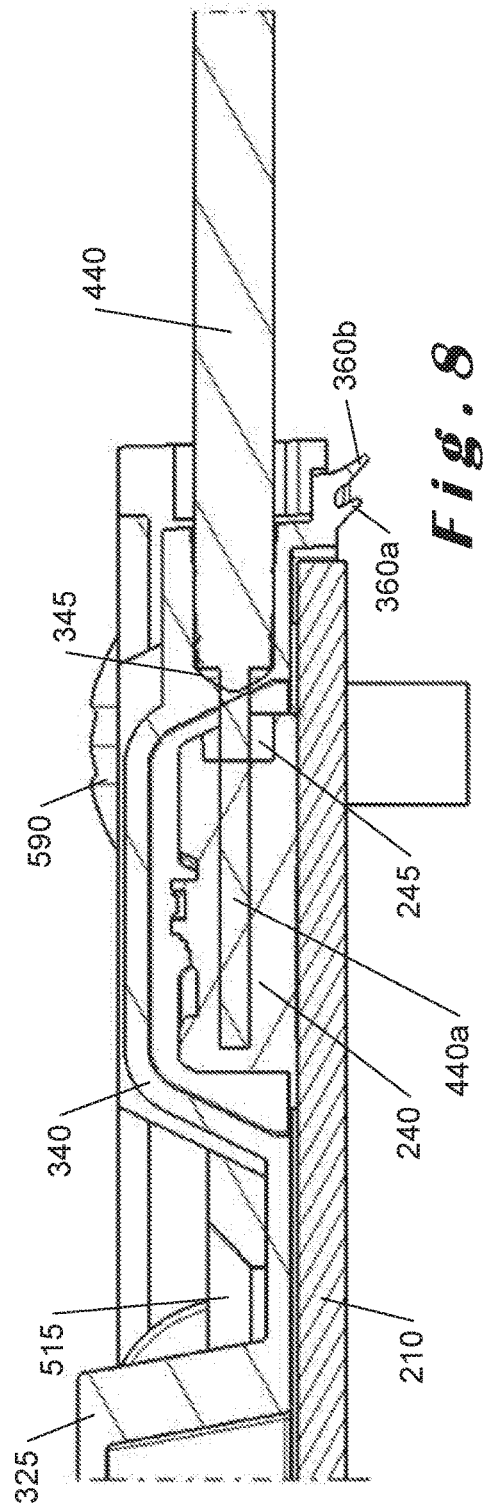

LIGHT-EMITTING DIODE MODULES

CROSS-REFERENCE TO RELATED APPLICATION

This application claims foreign priority benefits under 35 U.S.C. § 119 to European Patent Application No. 15180043 filed Aug. 6, 2015, which is hereby incorporated by reference in its entirety.

FIELD OF THE INVENTION

The present invention relates to improvements in or relating to light-emitting diode modules, and is more particularly concerned with providing water-tightness for such modules.

BACKGROUND OF THE INVENTION

Light emitting diode (LED) based luminaires often comprise LED modules comprising printed circuit boards (PCBs) on which LED elements are mounted with electrical connections to the PCB for supplying power to the LED elements. The LED elements are typically arranged in an array or pattern and mounted on the PCB, often termed PCB assembly (PCBA), which is appropriate for the luminaire in which they are to be used. Whilst each LED element comprises a light source with a primary optical element or lens, secondary optical elements are often required to direct the light produced by these light sources in directions appropriate to the particular implementation in a luminaire. Lenses are typically used as the secondary optical elements for directing the light.

For outdoor use, such LED modules together with their secondary optical elements are mounted within an enclosure having a window made of glass or polycarbonate to ensure that there is proper protection of the LED modules against the ingress of water. The window, whilst allowing light from the LED modules to be transmitted from the enclosure, forms another optical interface which generates additional light losses due to attenuation. Typically, light losses of up to around 7% are common for glass windows used for outdoor luminaires.

It is possible to reduce these light losses by using the material from which the secondary optical elements or lenses are made as the protective window. In such an assembly, the LED module is enclosed between a back surface and a surface formed by an array of secondary optical elements to form a sealed enclosure. Whilst such an arrangement may provide adequate protection for the LED module, it is still essential to provide wires to the LED module and water-tightness around the wires that extend into the sealed enclosure remains a source of water ingress if they are not properly surrounded by a suitable gasket material which maintains the seal for the enclosure.

CN-U-202947010 discloses a solution to this problem by providing a water-tight cable gland or gasket on a back surface of such a sealed enclosure through which wires enter into the sealed enclosure. However, whilst such a solution is suitable for LED modules having their own thermal heat sinks, it complicates the assembly of flat LED modules when they need to be mounted to a flat surface of a luminaire body as grooves and holes need to be provided to allow for the routing of wires and cables to the LED modules.

WO-A-2011/053349 discloses a mounting arrangement a LED module in which a gasket is provided over a rigid secondary lens array and which is held in place by a cover. The cover forms, with a base on which the LED module is mounted, an interior which encloses and compresses the gasket against the secondary lens array and the secondary lens array against the PCBA to form a sealed enclosure when screwed together. The gasket provides a weatherproof seal and a rigid metal wireway is provided for wiring to the LED module. One such rigid metal wireway is described in U.S. Pat. No. 7,566,147. The wireway is tube-shaped and defines a strong internal passageway through which the wires pass and enter into the sealed enclosure. A seal is placed between one end of the rigid metal wireway and a housing in which the sealed enclosure is mounted.

However, WO-A-2011/053349 requires additional components to form a seal for the LED module but not for the wiring, these additional components not only increasing the complexity of the mounting arrangement but also the cost of such an arrangement. In addition, the rigid metal wireway disclosed in U.S. Pat. No. 7,566,147 also increases complexity and cost as wires need to be carefully threaded through the wireway before the arrangement can be mounted to the housing.

SUMMARY OF THE INVENTION

It is therefore an object of the present invention to provide a simple arrangement in which a secondary lens array also forms an exterior for an LED module.

It is another object of the present invention to provide a gasket between an LED module and a luminaire to which it is mounted using a secondary lens array to provide water-tightness for the LED module.

It is a further object of the present invention to provide water-tightness for wiring for an LED module using a secondary lens array without the necessity of using other gaskets or seals.

In accordance with one aspect of the present invention, there is provided a water-tight light-emitting diode module comprising:—
   a base plate;
   a printed circuit board mounted on the base plate;
   a plurality of light-emitting diodes mounted on the printed circuit board;
   at least two electrical connections mounted on the printed circuit board and electrically connected for supplying power to each of the plurality of light-emitting diodes;
   a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections; and
   a lens holder mounted over the secondary lens array, the lens holder comprising a plurality of apertures formed therein for accommodating a respective one of the secondary lens elements and being configured to compress at least one portion of the secondary lens array to form at least one gasket between the lens holder and the base plate to prevent the ingress of water around the printed circuit board.

By forming the secondary lens array from a compressible material, it is possible to use the same material for gaskets formed by compressing portions of the secondary lens array between portions of the printed circuit board, the base plate and the lens holder.

This has the advantages of providing water-tight connections without incurring additional cost of having to implement separate gaskets.

Whilst in a preferred embodiment, the entire secondary lens array is made from the same material, it will readily be understood that different materials may be used for the secondary lens elements than that used for the portions of the secondary lens array which is to be used as gaskets.

In one embodiment, the secondary lens array comprises a peripheral lip portion which extends over a surface of the base plate.

This has the advantage of effectively sealing the printed circuit board within the secondary lens array so that the ingress of water is prevented.

The base plate may form one of: a heat sink and a part of a luminaire body to which the module is to be mounted.

In one embodiment, the lens holder comprises a skirt portion arranged around its periphery, the skirt portion being configured for compressing the peripheral lip portion of the secondary lens array against the surface of the base plate.

The provision of a skirt portion in the lens holder together with appropriate sizing thereof with respect to the printed circuit board and the secondary lens array provides the means of compressing the peripheral lip portion of the secondary lens array to form a gasket between the skirt portion and the surface of the base plate.

Advantageously, the skirt portion has at least two cut-out portions therein, each cut-out portion being configured to align substantially with a respective sheath portion and to provide access to a connection within a corresponding cover portion of the secondary lens array for a wire passing through the sheath portion. Each wire cover portion is configured to form a gasket around a wire inserted therethrough.

These cut-out portions provide access for wires and also provides a ledge for supporting the wires so that there is no excessive bending thereof which may affect gaskets formed around the wires by the sheath portions of the secondary lens array.

In an embodiment, the secondary lens array comprises a plurality of array mounting holes formed therein, each array mounting hole having an array boss portion associated therewith which is configured for passing through a corresponding mounting hole formed in the printed circuit board.

Additionally, the lens holder further comprises a plurality of holder mounting holes formed therein, each holder mounting hole having a holder boss portion associated therewith which is configured for engaging a corresponding array boss portion of the secondary lens array and for compressing the array boss portion against the corresponding mounting hole formed in the printed circuit board and against the surface of the base plate to form a seal therewith.

By providing boss portions associated with both the mounting holes of the secondary lens array and the mounting holes of the lens holder, gaskets can readily be provided around the mounting holes so that ingress of water between the secondary lens array and the printed circuit board through the mounting holes is prevented.

A plurality of mounting screws are preferably provided for mounting the lens holder and the secondary lens array to the base plate on which the printed circuit board is mounted, each mounting screw passing through one of the holder mounting holes and its associated holder boss portion and into an associated hole in the base plate.

It is preferred that the secondary lens array comprises an optical grade silicone material. In this case, the secondary lens array may be moulded in one piece. In addition, the natural flexibility of the silicone material enables its use as a gasket thereby avoiding the need for additional gaskets which are applied either in liquid or solid form.

In one embodiment, the lens holder is moulded in one piece. In this case, the lens holder may comprise one of polycarbonate, polyphenylene sulphide, polybutylene terephthalate and polyamide.

In accordance with another aspect of the present invention, there is provided a water-tight light-emitting diode module comprising:— a base plate;

a printed circuit board mounted on the base plate;

a plurality of light-emitting diodes mounted on the printed circuit board;

at least two electrical connections mounted on the printed circuit board and electrically connected for supplying power to each of the plurality of light-emitting diodes;

a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections, the secondary lens array comprising a peripheral lip portion which extends over a surface of the base plate; and a lens holder mounted over the secondary lens array, the lens holder comprising a plurality of apertures formed therein for accommodating a respective one of the secondary lens elements and being configured to compress at least one portion of the secondary lens array to form at least one gasket between the lens holder and the base plate to prevent the ingress of water around the printed circuit board, the lens holder comprises a skirt portion arranged around its periphery, the skirt portion being configured for compressing the peripheral lip portion of the secondary lens array against the surface of the base plate.

In accordance with a further aspect of the present invention, there is provided a water-tight light-emitting diode module comprising:— a base plate;

a printed circuit board mounted on the base plate, the printed circuit board including a plurality of mounting holes by means of which it is mounted to the base plate;

a plurality of light-emitting diodes mounted on the printed circuit board;

at least two electrical connections mounted on the printed circuit board and electrically connected for supplying power to each of the plurality of light-emitting diodes;

a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections, the secondary lens array comprising a plurality of array mounting holes formed therein, each array mounting hole having an array boss portion associated therewith which is configured for passing through a corresponding mounting hole formed in the printed circuit board; and a lens holder mounted over the secondary lens array, the lens holder comprising a plurality of apertures formed therein for accommodating a respective one of the secondary lens elements and being configured to compress at least one portion of the secondary lens array to form at least one gasket between the lens holder and the base plate to prevent the ingress of water around the printed circuit board, the lens holder further comprising a plurality of holder mounting holes formed therein, each holder mounting hole having a holder boss portion associated therewith which is configured for engaging a corresponding array boss portion of the secondary lens array and for compressing the array boss portion against the corresponding hole formed in the printed circuit board and against the surface of the base plate to seal therewith.

In accordance with yet a further aspect of the present invention, there is provided a luminaire comprising at least one water-tight light-emitting diode module as described above.

BRIEF DESCRIPTION OF THE DRAWINGS

For a better understanding of the present invention, reference will now be made, by way of example, to the accompanying drawings in which:—

FIG. 7 illustrates a sectioned view of the terminal end of the assembled LED module taken along line VII-VII of FIG. 4;

FIG. 8 illustrates a sectioned end view of the terminal end of the assembled LED module taken along line VIII-VIII of FIG. 3.

DESCRIPTION OF THE INVENTION

Figure 1:
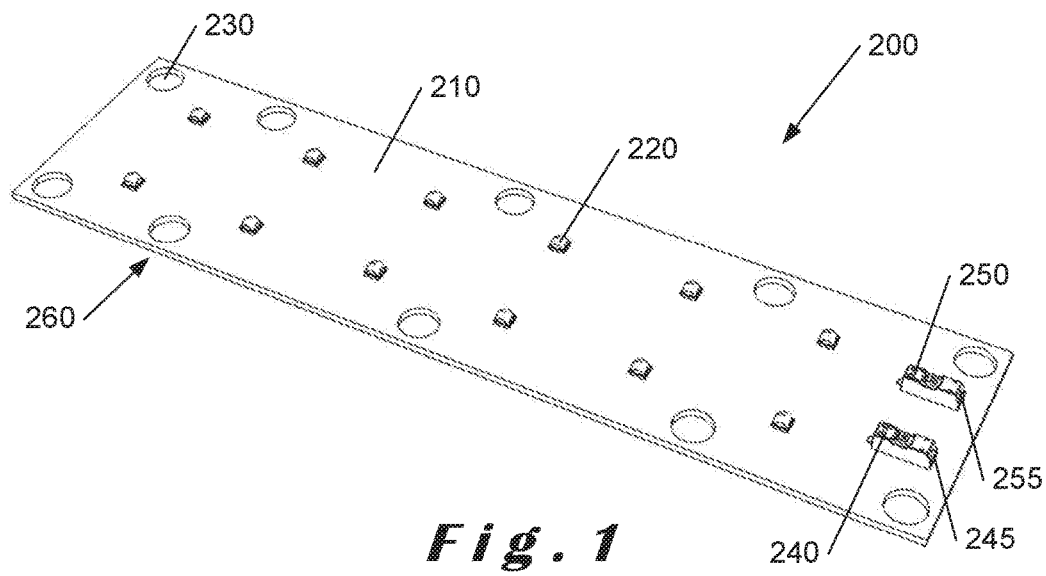
FIG. 1 illustrates a perspective top view of printed circuit board assembly.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

Although the present invention will be described with reference to LED modules suitable for luminaires, it will readily be appreciated that the invention is not limited to such an implementation and can be used in any LED module, particularly if it requires prevention of water ingress.

The terms "printed circuit board assembly" and "PCBA" as used herein refer to a printed circuit board (PCB) on which an array of LED elements are mounted. These terms also include wiring connections to provide power to each LED element.

The term "light-emitting light diode module" or "LED module" as used herein refers to a PCBA, a secondary lens array and a lens holder for mounting the secondary lens array on the PCBA. It is essential that each element of the secondary lens array is correctly aligned with an associated LED element in the LED array of the PCBA.

The term "lens array" as used herein refers to an arrangement or pattern of at least one lens element. In the embodiment described below, each lens array comprises twelve lens elements which are integrally formed as a single component.

It will, however, be appreciated a lens array may comprise any number of lens elements arranged to form the lens array.

The term "secondary lens array" as used herein refers to a lens array which the lens elements are designed as light beam shapers to create a predetermined light distribution and which are positioned over associated LED elements of the array of LED elements. Such lens arrays are typically used as secondary lenses in luminaires for street lighting applications. In accordance with the present invention, the secondary lens array is moulded as a single component from an optical grade silicone material.

The term "silicone material" as used herein refers to an optical grade silicone material having a Shore 00 hardness value in the range of between 60 and 100. As will readily be understood, these values range from soft to medium hard and will affect the pliability, flexibility and durability of lens arrays made from such materials. Silicone materials are also resistant to higher temperatures (for example, temperatures in excess of 85° C. and possibly as high as 150° C.) and therefore provide the capability that less of the expensive material used for heat sinks needs to be used in the luminaire.

Silicone lenses used as secondary lenses may have different sizes and structures depending on their optical properties, and enable operation of lighting devices incorporating such lenses at higher temperature ranges. This means that it is possible to either increase the operating temperature range whilst using conventional heat sinks for heat dissipation or to reduce the amount of heat sinks required for heat dissipation without adversely affecting the operation of the luminaire. Naturally, by reducing the amount of material needed for heat dissipation, cost benefits can be provided.

It will readily be appreciated that the optical properties of the silicone lenses needs to be maintained over the full operating temperature and not show any degradation over time when operating at higher temperatures. In addition, silicone is resistant to degradation by ultraviolet (UV) radiation and is a good candidate for use as lenses exposed to exterior or outdoor conditions.

In accordance with the present invention, the silicone lenses are formed as a secondary lens array which not only meets the requirements for higher operating temperatures but is also compressible in predetermined areas (non-lens areas) to form gaskets between the PCBA and the lens holder.

In accordance with the present invention, by using a suitable silicone material for the secondary lens array, a sealed enclosure can readily be provided where the secondary lens array forms at least one water-tight seal or gasket preventing water ingress into the enclosure as described in more detail below.

FIG. 1 illustrates a PCBA 200 comprising a PCB 210 on which are mounted twelve LED elements 220. The PCB 210 has a base plate (100 shown in FIG. 9) to which the PCB 210 is attached or mounted. The PCB 210 also includes ten mounting holes 230 through which mounting screws (described below with reference to FIGS. 5 to 9) are inserted for mounting an LED module of which the PCBA 200 forms a part to a luminaire housing. In addition, the PCB 210 includes terminal blocks 240, 250 located at a terminal end thereof to which wires (not shown) are connected for supplying power to the PCBA 200. The terminal blocks 240, 250 include plug-in connectors 245, 255 for wires as will be described in more detail below with reference to FIGS. 3 and 4.

It will readily be appreciated that each terminal block 240, 250 comprises a connection for providing power to the LED elements 220 on the PCB 210.

Although only twelve LED elements 210 are shown, it will readily be appreciated that any suitable number of LED elements may be provided according to the particular implementation. In addition, the array of LED elements need not be configured in the pattern shown in FIG. 2 but any other suitable pattern is also possible.

Figure 9:
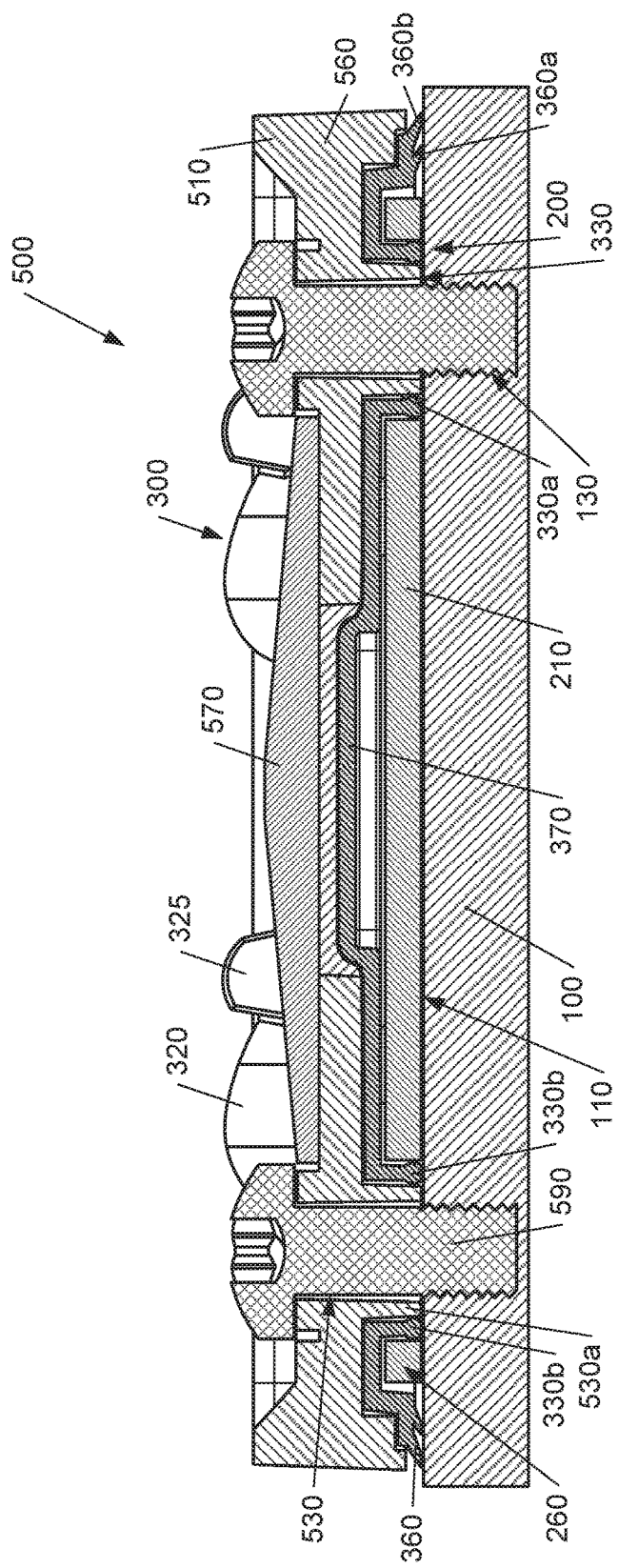
FIG. 9 illustrates a cross-section of the assembled LED module taken along line IX-IX of FIG. 7.

The PCB 210 has an edge 260 which extends around its periphery and against which the secondary lens array 300 seals as will be described in more detail below with reference to FIGS. 5 and 6. The base plate 100 (as shown in FIG. 9) preferably extends beyond the edge 260 of the PCB 210 and has a surface 110 which is configured to engage with corresponding portions of a peripheral lip of a secondary lens array as will be described in more detail below with reference to FIG. 9.

Figure 2:
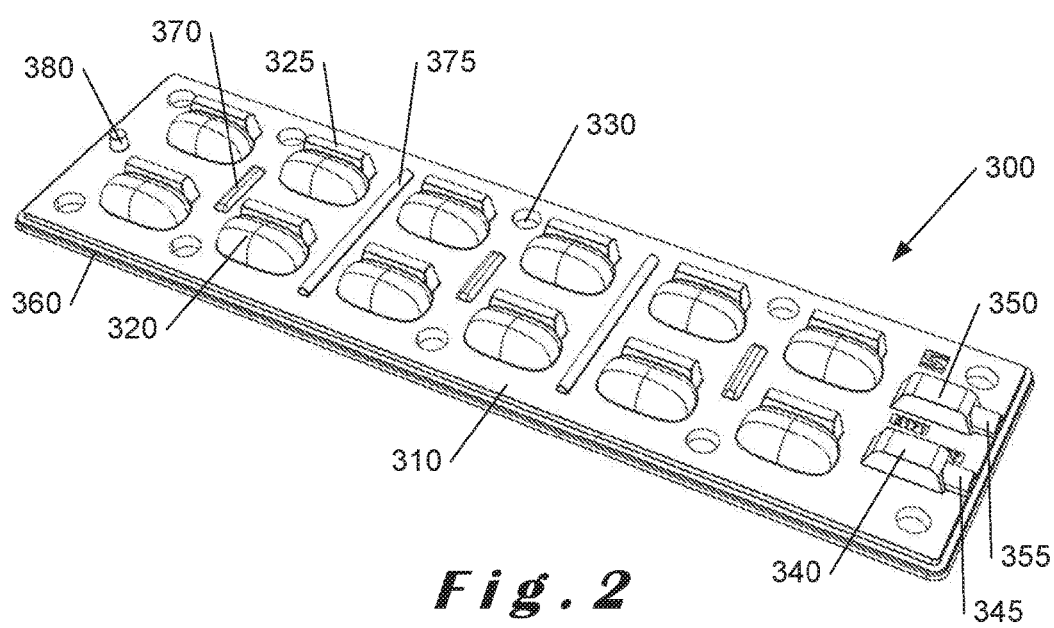
FIG. 2 illustrates a perspective top view of a secondary lens array in accordance with the present invention.

FIG. 2 illustrates a secondary lens array 300 in accordance with the present invention which is mountable to the PCBA 200 shown in FIG. 1. The secondary lens array 300 comprises a body portion 310 in which twelve secondary lens elements 320 are formed, one lens element for each LED element 210. Ten mounting holes 330 are shown which correspond to the mounting holes 230 of the PCBA 200, the mounting screws being inserted through both sets of holes as will be described in more detail below with reference to FIGS. 6 and 9.

Cover portions 340, 350 are provided at a terminal end of the secondary lens array 300 and which are aligned with and cover respective ones of terminal blocks 240, 250 provided at the terminal end of the PCB 210 to prevent the ingress of water. Each cover portion 340, 350 has an associated sheath portion 345, 355 which extends from an end thereof to the end of the body portion 310 of the secondary lens array 300.

In accordance with the present invention, the body portion 310 has a peripheral lip 360 which forms a gasket or water-tight edge for the PCBA 200 when assembled as will be described in more detail below. In addition, each sheath portion forms a gasket or water-tight seal around a wire inserted therein as will be described in more detail below.

Each mounting hole 330 formed in the body portion 310 has a boss portion (as shown in FIG. 9) which extends into a corresponding hole 230 in the PCBA 200 and acts as a water-tight gasket for each mounting screw (FIGS. 5 to 9) to prevent the ingress of water, through the screw holes, between the secondary lens array 300 and the PCBA 200 as will be described in more detail below with reference to FIG. 9.

Three short ribs 370 are formed in the centre of each group of four secondary lens elements 320, and two long ribs 375 are formed between each group of four secondary lens elements. These ribs provide location points for a lens holder as will be described in more detail below.

An alignment pin 380 is also formed at an end of the secondary lens array 300 which is remote from the terminal block cover portions 340, 350. The functionality of the ribs and the alignment pin will be described in more detail below.

In the illustrated embodiment of the secondary lens array 300, light shields 325 are provided for each secondary lens element 320 so that light passing through the secondary lens element 320 is blocked in a particular direction. However, it will be appreciated that these light shields are not essential.

It will readily be appreciated that the number of secondary lens elements 320 in the secondary lens array 300 is chosen to match the number of LED elements 220 in the PCBA 200. Moreover, the alignment and/or orientation of the secondary lens elements 320 within the secondary lens array 210 is not limited to the alignment and orientation shown in FIG. 2 and described herein and may be any other suitable alignment and/or orientation in accordance with the particular lighting application.

It will readily be appreciated that the base plate 100 (FIG. 9) on which the PCBA 200 is mounted and with which the secondary lens array 300 seals around its peripheral edge when assembled is not shown in FIGS. 3 to 6 for clarity.

Figure 3:
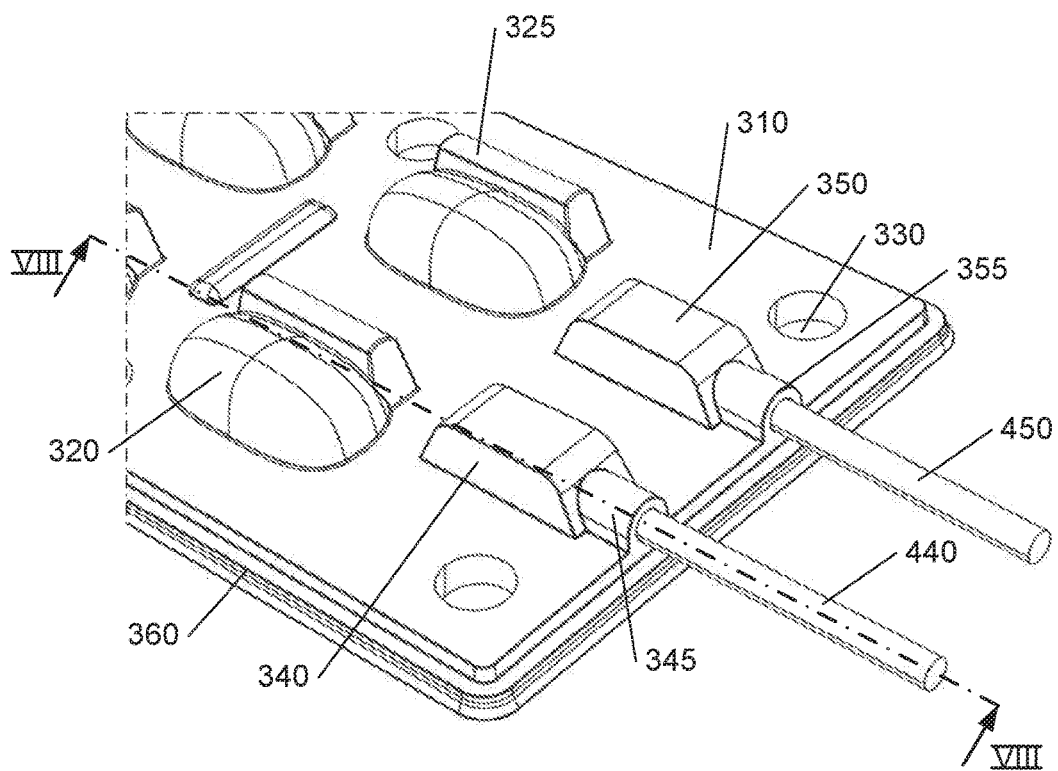
FIG. 3 is an enlarged perspective view of a terminal end of the secondary lens array of FIG. 2.
Figure 4:
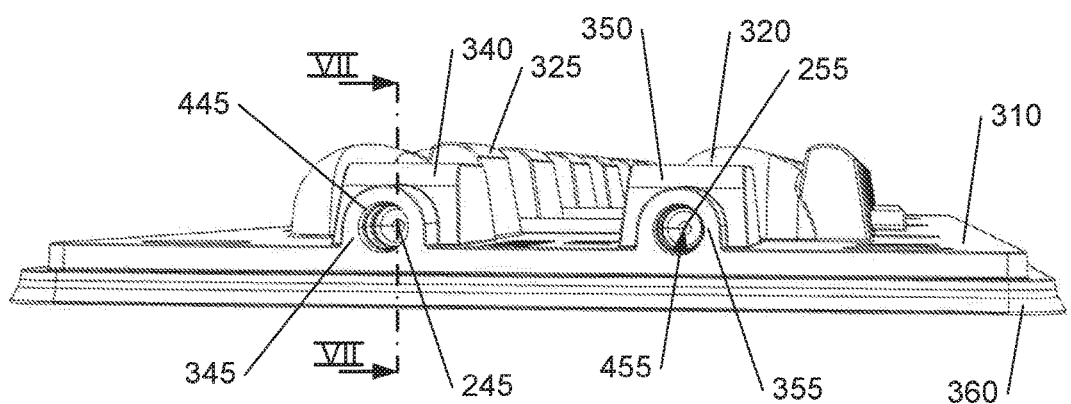
FIG. 4 is an end view of the terminal end of the secondary lens array of FIG. 2.

FIG. 3 illustrates an enlarged view of the terminal end of an assembled secondary lens array 300 and PCBA 200 but the latter is not visible in the Figure. As shown, wires 440, 450 from a power supply (not shown) are inserted into cylindrical holes 445, 455 (as shown in FIG. 4) of the sheath portions 345, 355 and into the cover portions 340, 350 to plug into the plug-in connectors 245, 255 of terminal blocks 240, 250 (as shown in FIG. 9). The cylindrical holes 445, 455 of the sheath portions 345, 355 act as gaskets preventing the ingress of water along the wires 440, 450.

The internal diameter of the cylindrical holes 445, 455 and the external diameter of the wires 440, 450 may be chosen to provide a tight or interference fit. Due to the flexible nature of the silicone material, the sheath portions 345, 355 may stretch slightly to accommodate the external diameter of the wires as the wires are inserted into the plug-in connectors 245, 255 and then relax back to their normal shape and size afterwards.

In one embodiment, the internal diameter of each cylindrical hole 445, 455 is shaped to create an angle of release from a moulding tool used to mould the secondary lens array in a single component. One embodiment of the internal diameter of the cylindrical holes 445, 455 is described in more detail below with reference to FIG. 7.

FIG. 4 illustrates a side view of the terminal end of the assembly shown in FIG. 3. As before, the PCBA 200 is not visible except for the plug-in connectors 245, 255 of the terminal blocks 240, 250.

In accordance with the present invention, a lens holder is provided for mounting the secondary lens array with respect to the PCBA. The lens holder comprises a simple frame to surround and retain the secondary lens elements as will be described in more detail below with reference to FIG. 5.

Figure 5:
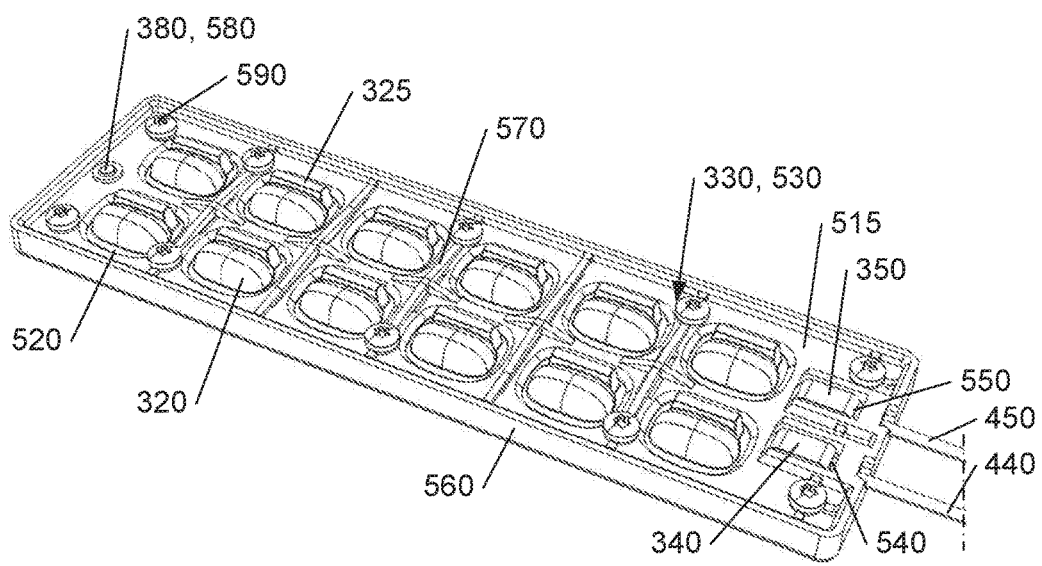
FIG. 5 illustrates a perspective top view of a lens array holder for the secondary lens array of FIG. 2 in accordance with the present invention.

Turning now to FIG. 5, a top perspective view of an assembly 500 of a PCBA (not shown), a secondary lens array 300 and a lens holder 510 in accordance with the present invention. The lens holder 510 comprises a frame 515 having twelve apertures 520 shaped to receive a respective one of the secondary lens elements 320 and their associated light shields 325 when assembled.

Ten holes 530 are formed in the frame 515 which correspond with the ten holes 230 formed in the PCB 200 and the ten holes 330 formed in the secondary lens array 300. Each hole 530 includes a boss portion (as shown in FIG. 9) configured to extend through a corresponding boss portion of the secondary lens array 300 as will be described in more detail below with reference to FIG. 9. Mounting screws 590 are used to fix the frame 515 of the lens holder to the PCBA 200 sandwiching the secondary lens array 300 therebetween and to fix the entire assembly to a mounting plate or other surface to which the LED module is to be mounted (not shown).

Cut-outs 540, 550 are provided at the terminal end of the frame 515 to accommodate the cover portions 340, 350 for the terminal blocks 240, 250 (FIG. 1).

A skirt 560 extends from the frame 515 which, when assembled, engages with the peripheral lip 360 of the secondary lens array 300 to form a seal with the base plate 100 (FIG. 9) as will be described in more detail below. The skirt 560 of the frame 515 is sized to seal against the peripheral lip 360 of the secondary lens array 300 and to cause the peripheral lip 360 to seal against the peripheral edge 260 of the PCB 210 and against surface 110 of the base plate 100.

Five transverse ribs 570 are formed in the frame 515 and are configured to engage with the three short ribs 370 in the centre of each group of four secondary lens elements 320 and the long ribs 375 between each group formed on the secondary lens assembly 300 when assembled.

The frame 515 also includes an aperture or hole 580 with which the alignment pin 380 of the secondary lens array 300 engages when assembled. This aperture or hole 580, together with the transverse ribs 570, ensures correct alignment of the secondary lens array 300 with the lens holder 510 so that the secondary lens elements 320 and their associated light shields 325 are located within apertures 520 of the lens holder 510.

Non-limiting examples of materials from which the lens holder 510 may be made include thermoplastic materials, for example, polycarbonate (PC), polyphenylene sulphide (PPS), polybutylene terephthalate (PBT) and polyamide (PA).

For construction of the LED module assembly 500, the secondary lens array 300 (FIGS. 2 to 5) is positioned over the PCBA 200 (FIG. 2) with the peripheral lip 360 extending over the edges of the PCBA 200 so that only the base plate 100 (FIG. 10) on which the PCB 210 is mounted is not encompassed by the secondary lens array 300. The surface on which the PCBA 200 is mounted forms a surface against which the peripheral lip 360 of the secondary lens array 300 can seal as will be described in more detail below with reference to FIG. 9.

In addition, the boss portions 330a (as shown in FIG. 9) associated with mounting holes 330 of the secondary lens array 300 pass through corresponding holes 230 formed in the PCBA 200. The cut-outs 540, 550 provided at the terminal end of the frame 515 are located around the cover portions 340, 350 and the associated sheath portions 345, 355 so that the respective cylindrical holes 445, 455 are accessible for wiring connections.

Figure 6:
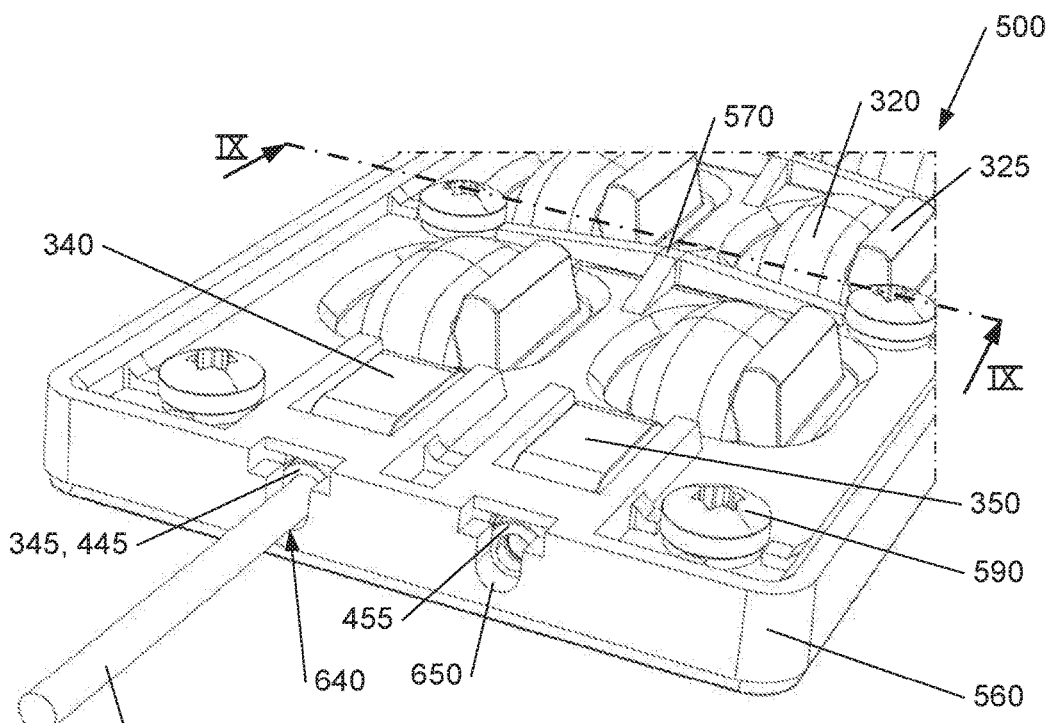
FIG. 6 illustrates an enlarged perspective view of the terminal end of an assembled LED module in accordance with the present invention.

The skirt 560 of the lens holder 510 has further cut-outs 640, 650, as shown more clearly in FIG. 6, to provide access to the cylindrical holes 445, 455. Each of these cut-outs 640, 650 generally forms by a U-shaped ledge which provides both centring for respective ones of the wires 440, 450 as they are inserted into their associated sheath portions 345, 355 but also provides support for each wire when fully inserted into their respective terminal block 240, 250.

The lens holder 510 is placed over the secondary lens array 300 with the transverse ribs 570 of the lens holder 510 engaging the short ribs 370 and the long ribs 375 of the secondary lens array 300. Screws 590 are inserted into the holes 530 in the frame 515 of the lens holder 510 and down through the boss portions associated with holes 330 formed in the secondary lens array 300 which extend through holes 230 in the PCBA 200 and into holes 130 formed in the base plate (FIG. 9).

FIG. 6 illustrates an enlarged view of the terminal end of the assembly 500. The cut-outs 640, 650 provide access to the terminal blocks 240, 250 provided on the PCB 210 through the sheath portions 345, 355 and into the cover portions 340, 350 over the terminal blocks 240, 250. As shown, wire 440 is inserted into its plug-in connector (not shown in FIG. 6) in terminal block 240 (FIG. 1) through the sheath portion 345 and terminal block cover portion 340.

Wire 450 is not shown in FIG. 6 so that cut-out 650 can be more clearly seen. As shown, the cut-out 650 forms a ledge on which the wire can be supported when inserted into the respective plug-in connector in the terminal block as described above. It will readily be appreciated that cut-out 640 is substantially identical to cut-out 650.

FIG. 7 illustrates a cross-sectioned view of the terminal end of the assembly 500, taken along line VII-VII of FIG. 4, which shows the terminal block 240 and its associated plug-in connector 245. The plug-in connector 245 is substantially aligned with the sheath portion 345 and the cylindrical hole 445 formed therein. The cut-out 640 in the frame 515 is also substantially aligned with the plug-in connector 245.

As shown in FIG. 7, cylindrical hole 445 comprises a plurality of shoulder portions of different decreasing diameters in the direction of insertion of the wire 440 (FIG. 8). This structure of decreasing diameters provides smooth insertion of the wire 440 whilst forming a plurality of gasket portions along the length of the wire within the cylindrical hole 445 which seal against the external diameter of the wire.

FIG. 8 illustrates a cross-sectioned view of a terminal end of the assembly 500 taken along line VIII-VIII of FIG. 3 and is similar to FIG. 7 but with a wire 440 inserted into the sheath portion 345 and sealing therewith and the extension of a conductor 440a of the wire 440 extending into and through the plug-in connector 245. The wire 440, once inserted through the silicone material forming the sheath portion 345 and with its conductor 440a fully engaged with the plug-in connector 245, is held in place due to the constriction of the sheath portion 345 on the external diameter of the wire 440 to form a water-tight connection as described above.

As described above with reference to FIG. 6, the skirt 560 of the frame 515 has cut-outs 640, 650 which are shaped to support the wires 440, 450 and as well as providing access to the terminal blocks 240, 250 and their associated plug-in connectors 245, 255. These cut-outs 640, 650 are configured to prevent excessive bending of the wires 440, 450 that might create undesired stress on the silicone material forming the wire cover portions 345, 355.

FIG. 9 is a cross-sectioned view taken along lines IX-IX of FIG. 8. As can readily be seen, the secondary lens array 300 fits over the PCBA 200 with the lip 360 of the secondary lens array extending around the periphery of the PCBA 200 and engaging with a surface of the base plate 100 on which the PCB 210 is mounted. The PCBA 200 is in direct contact with surface 110 of the base plate 100 as will be described in more detail below.

The base plate 100 is substantially flat and effectively comprises a block of material having a plurality of threaded holes formed therein for receiving the mounting screws 590 as will be described in more detail below and for mounting the base plate to a luminaire body (not shown). In one embodiment, the base plate 100 may comprise only a simple mounting plate for the module 500. In another embodiment, the base plate 100 may comprise a heat sink for the module 500 so that no additional heat sink is required. In a further embodiment, the base plate 100 forms part of a heat sink with a luminaire body to which it is mounted (not shown).

Boss portion 330a associated with hole 330 extends through the hole 230 in the PCBA 200. The lens holder 510 is also shown with holder boss portions 530a extending through respective boss portions 330a of the secondary lens array 300. When assembled, mounting screws 590 extend through respective holes 530 in the lens holder 510, through the associated holder boss portion 530a and into the base plate 100 on which the PCBA 200 is mounted. Each holder boss portion 530a may be slightly tapered so that insertion of the mounting screw 590 expands the boss portion to compress the array boss portions 330a associated with the mounting holes 330 formed in the secondary lens array 300 against the holes 230 formed in the PCBA 200 and compresses ends 330b of the array boss portions 330a against the surface 110 of the base plate 100.

As shown, the secondary lens array 300 made from silicone forms a gasket between: the skirt 560 of the lens holder 510 and the peripheral edge 260 of the PCBA 200; and the boss portions 530a of the lens holder 510 and the holes 230 in the PCBA 200 with ends 330b of the array boss portions 330a being compressed against the surface 110 of the base plate 100. Additionally, the secondary lens array 300 also forms gaskets around the wires 440, 450 (FIG. 3) in the sheath portions 345, 355 as described above.

In one embodiment, the peripheral edge 360 of the secondary lens array 300 has a pair of peripheral lips 360a, 360b formed therein, which when compressed by the lens holder 510 flatten out to be flush with the surface 110 of the base plate 100 to form a pair of seals preventing the ingress of water as shown in FIG. 9. Although not shown in FIG. 9 (for clarity), it is possible that the peripheral lips 360a, 360b lie totally flat against the surface 110 of the base plate 100.

It will readily be understood that the sealing of the peripheral edge 360 against the surface 110 of the base plate 100 may be implemented in other ways and is not limited to the pair of peripheral lips 360a, 360b as described above. More lips or other means may be provided for effecting the seal between the peripheral edge 360 of the secondary lens array 300 against the surface 110 of the base plate 100.

In addition, although only one LED module 500 is described above mounted on the base plate 100, it will readily be appreciated that more than one such LED module may be mounted on the base plate 100, each having a secondary lens array which forms gaskets therewith to prevent the ingress of water into the LED module 500 and particularly between the secondary lens array and the PCBA 200.

It will be appreciated that, although the invention described above comprises a non-conductive lens holder, lens holders comprising conductive materials, for example, metals, may also be used as the silicone secondary lens array has good electrical insulation properties which meet with electrical safety regulations.

Although the present invention has been described with reference to the use of silicone as the material from which the secondary lens array 300 is made, it will be appreciated that the secondary lens array may comprise other materials or combinations of materials which are compatible with one another and which provide the features of being able to moulded in one piece with optical grade lenses and being compressible to form gaskets in the locations of the assembly as described above.

The invention claimed is:

1. A light-emitting diode module comprising:
a printed circuit board;
a plurality of light-emitting diodes mounted on a first side of the printed circuit board;
at least two electrical connections mounted on the first side of the printed circuit board and electrically connected for supplying power to each of the plurality of light-emitting diodes;
a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections; and
a lens holder mounted over the secondary lens array, the lens holder comprising a plurality of apertures formed therein for accommodating a respective one of the secondary lens elements and being configured to compress at least one portion of the secondary lens array to form at least one gasket between the lens holder and the printed circuit board to prevent the ingress of water around the printed circuit board;
wherein the cover portions and the sheath portions are over the first side of the printed circuit board, and the sheath portions are extensions of the cover portions.

2. A light-emitting diode module according to claim 1, wherein the secondary lens array comprises a peripheral lip portion configured to extend over a surface of a base plate on which the printed circuit board is mounted.

3. A light-emitting diode module according to claim 2, wherein the lens holder comprises a skirt portion arranged around its periphery, the skirt portion being configured for compressing the peripheral lip portion of the secondary lens array against the surface of the base plate.

4. A light-emitting diode module according to claim 3, wherein the skirt portion has at least two cut-out portions therein, each cut-out portion being configured to align substantially with a respective sheath portion and to provide access to a connection within a corresponding cover portion of the secondary lens array for a wire passing through the sheath portion.

5. A light-emitting diode module according to claim 1, further comprising a base plate, the printed circuit board being mounted on the base plate, and wherein the base plate forms one of: a heat sink and a part of a luminaire body to which the module is to be mounted.

6. A light-emitting diode module according to claim 1, wherein each sheath portion is configured to form a gasket around a wire inserted therethrough.

7. A light-emitting diode module according to claim 1, wherein the secondary lens array comprises a plurality of array mounting holes formed therein, each array mounting hole having an array boss portion associated therewith which is configured for passing through a corresponding mounting hole formed in the printed circuit board.

8. A light-emitting diode module according to claim 7, wherein the lens holder further comprises a plurality of holder mounting holes formed therein, each holder mounting hole having a holder boss portion associated therewith which is configured for engaging a corresponding array boss portion of the secondary lens array and for compressing the array boss portion against the corresponding hole formed in the printed circuit board and against the surface of a the base plate to seal therewith, the printed circuit board being mounted on the base plate.

9. A light-emitting diode module according to claim 8, further comprising a plurality of mounting screws for mounting the lens holder and the secondary lens array to the base plate on which the printed circuit board is mounted, each mounting screw passing through one of the holder mounting holes and its associated holder boss portion and into an associated hole in the base plate.

10. A light-emitting diode module according to claim 1, wherein the secondary lens array comprises an optical grade silicone material.

11. A light-emitting diode module according to claim 1, wherein the secondary lens array is molded in one piece.

12. A light-emitting diode module according to claim 1, wherein the lens holder is molded in one piece.

13. A light-emitting diode module according to claim 12, wherein the lens holder comprises one of polycarbonate, polyphenylene sulphide, polybutylene terephthalate and polyamide.

14. A luminaire comprising at least one light-emitting diode module according to claim 1.

15. A light-emitting diode module according to claim 1, wherein each electrical connection includes a terminal block.

16. A light-emitting diode module according to claim 15, wherein the terminal blocks are located at a terminal end of the printed circuit board.

17. A light-emitting diode module according to claim 15, wherein the terminal blocks and the light-emitting diodes are mounted on a same side of the printed circuit board.

18. A light-emitting diode module comprising:
a base plate;
a printed circuit board mounted on the base plate;
a plurality of light-emitting diodes mounted on a first side of the printed circuit board;
at least two electrical connections mounted on the first side of the printed circuit board and electrically connected for supplying power to each of the plurality of light-emitting diodes;
a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections; and
a lens holder mounted over the secondary lens array, the lens holder comprising a plurality of apertures formed therein for accommodating a respective one of the secondary lens elements and being configured to compress at least one portion of the secondary lens array to form at least one gasket between the lens holder and the base plate to prevent the ingress of water around the printed circuit board,
wherein the cover portions and the sheath portions are over the first side of the printed circuit board, and the sheath portions are extensions of the cover portions.

19. A luminaire comprising at least one light-emitting diode module according to claim 18.

20. A light-emitting diode module comprising:
a base plate;
a printed circuit board mounted on the base plate, the printed circuit board including a plurality of mounting holes by means of which it is mounted to the base plate;
a plurality of light-emitting diodes mounted on the printed circuit board;
at least two electrical connections mounted on the printed circuit board and electrically connected for supplying power to each of the plurality of light-emitting diodes;
a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections, the secondary lens array comprising a plurality of array mounting holes formed therein, each array mounting hole having an array boss portion associated therewith which is configured for passing through a corresponding mounting hole formed in the printed circuit board; and
a lens holder mounted over the secondary lens array, the lens holder comprising a plurality of apertures formed therein for accommodating a respective one of the secondary lens elements and being configured to compress at least one portion of the secondary lens array to form at least one gasket between the lens holder and the base plate to prevent the ingress of water around the printed circuit board, the lens holder further comprising a plurality of holder mounting holes formed therein, each holder mounting hole having a holder boss portion associated therewith which is configured for engaging a corresponding array boss portion of the secondary lens array and for compressing the array boss portion against the corresponding hole formed in the printed circuit board and against the surface of the base plate to seal therewith,
wherein the cover portions and the sheath portions are over the first side of the printed circuit board, and the sheath portions are extensions of the cover portions.

21. A luminaire comprising at least one light-emitting diode module according to claim 20.

22. A light-emitting diode module comprising:
a printed circuit board;
a plurality of light-emitting diodes mounted on a first side of the printed circuit board;
at least two electrical connections mounted on the first side of the printed circuit board and electrically connected for supplying power to each of the plurality of light-emitting diodes; and
a secondary lens array mounted over the plurality of light-emitting diodes on the printed circuit board, the secondary lens array comprising a plurality of secondary lens elements and being configured to provide a cover portion for each of the electrical connections and a sheath portion for each wire being connected to each of the electrical connections,
wherein the cover portions and the sheath portions are over the first side of the printed circuit board, and the sheath portions are extensions of the cover portions,
wherein each sheath portion is configured to receive only one wire and to form a sheathing gasket around said wire inserted therethrough.

23. A secondary lens array designed to be mounted over a plurality of light-emitting diodes mounted on a first side of a printed circuit board, and comprising:
a plurality of secondary lens elements,
cover portions for covering at least two electrical connections mounted on the first side of the printed circuit board, the electrical connections being electrically connected for supplying power to each of the plurality of light-emitting diodes, and
sheath portions for wires inserted therein and connected to the electrical connections,
wherein the cover portions and the sheath portions are designed to be located over the first side of the printed circuit board, and the sheath portions are extensions of the cover portions,
wherein each sheath portion is configured to receive only one wire and to form a sheathing gasket around said wire inserted therethrough.

* * * * *